US009715933B2

(12) United States Patent
Hsu

(10) Patent No.: US 9,715,933 B2
(45) Date of Patent: Jul. 25, 2017

(54) DUAL FUNCTION HYBRID MEMORY CELL

(71) Applicant: NEO Semiconductor, Inc., San Jose, CA (US)

(72) Inventor: Fu-Chang Hsu, San Jose, CA (US)

(73) Assignee: NEO Semiconductor, Inc., San Jose, CA (US)

( * ) Notice: Subject to any disclaimer, the term of this patent is extended or adjusted under 35 U.S.C. 154(b) by 0 days.

(21) Appl. No.: 15/136,838

(22) Filed: Apr. 22, 2016

(65) Prior Publication Data

US 2016/0314839 A1    Oct. 27, 2016

Related U.S. Application Data

(60) Provisional application No. 62/152,813, filed on Apr. 24, 2015.

(51) Int. Cl.
| | | |
|---|---|---|
| G11C 16/04 | (2006.01) | |
| G11C 16/10 | (2006.01) | |
| H01L 29/792 | (2006.01) | |
| H01L 27/12 | (2006.01) | |
| H01L 21/28 | (2006.01) | |

(Continued)

(52) U.S. Cl.
CPC ........ *G11C 16/0475* (2013.01); *G11C 7/1015* (2013.01); *G11C 11/401* (2013.01); *G11C 16/10* (2013.01); *H01L 21/28282* (2013.01); *H01L 27/1211* (2013.01); *H01L 29/4234* (2013.01); *H01L 29/66833* (2013.01); *H01L 29/785* (2013.01); *H01L 29/792* (2013.01); *G11C 16/0466* (2013.01); *G11C 2211/4016* (2013.01)

(58) Field of Classification Search
CPC .................. H01L 29/792; G11C 16/0466
USPC ................ 365/185.28, 185.08; 257/324
See application file for complete search history.

(56) References Cited

U.S. PATENT DOCUMENTS 6,168,995 B1   1/2001   Kelly et al.
6,903,407 B1   6/2005   Kang
(Continued)

OTHER PUBLICATIONS

International Search Report, mailing date of Jul. 29, 2016, for corresponding International Application No. PCT/US2016/029059.
(Continued)

*Primary Examiner* — Son Mai
(74) *Attorney, Agent, or Firm* — Intellectual Property Law Group LLP

(57) ABSTRACT

A dual function hybrid memory cell is disclosed. In one aspect, the memory cell includes a substrate, a bottom charge-trapping region formed on the substrate, a top charge-trapping region formed on the bottom charge-trapping region, and a gate layer formed on the top charge trapping region. In another aspect, a method for programming a memory cell having a substrate, a bottom charge-trapping layer, a top charge-trapping layer, and a gate layer is disclosed. The method includes biasing a channel region of the substrate, applying a first voltage differential between the gate layer and the channel region, injecting charge into the bottom charge-trapping layer from the channel region based on the first voltage differential. The method also includes applying a second voltage differential between the gate layer and the channel region and injecting charge from the bottom charge-trapping layer into the top charge-trapping layer based on the second voltage differential.

20 Claims, 10 Drawing Sheets

(51) Int. Cl.
*H01L 29/423* (2006.01)
*H01L 29/66* (2006.01)
*H01L 29/78* (2006.01)
*G11C 7/10* (2006.01)
*G11C 11/401* (2006.01)

(56) References Cited

U.S. PATENT DOCUMENTS

| | | | | |
|---|---|---|---|---|
| 8,530,951 B2* | 9/2013 | Bhattacharyya | ....... | B82Y 10/00 257/314 |
| 8,604,537 B2* | 12/2013 | Lee | ............. | H01L 29/42324 257/324 |
| 8,685,813 B2* | 4/2014 | Ramkumar | ....... | H01L 21/28282 257/314 |
| 9,018,693 B2* | 4/2015 | Ramkumar | ........... | H01L 29/792 257/324 |
| 9,299,568 B2* | 3/2016 | Jenne | ................ | H01L 21/28282 |
| 2006/0007741 A1 | 1/2006 | Yeh | | |
| 2007/0221981 A1 | 9/2007 | Saeki | | |
| 2009/0097320 A1* | 4/2009 | Min | ................ | B82Y 10/00 365/185.18 |
| 2013/0126981 A1* | 5/2013 | Ho | ................ | H01L 27/0924 257/390 |
| 2013/0175600 A1* | 7/2013 | Jenne | ............... | H01L 21/28282 257/324 |

OTHER PUBLICATIONS

Written Opinion of the International Searching Authority, mailing date of Jul. 29, 2016, for corresponding International Application No. PCT/US2016/029059.

* cited by examiner

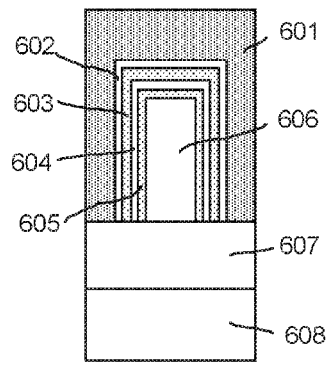
FIG. 6A
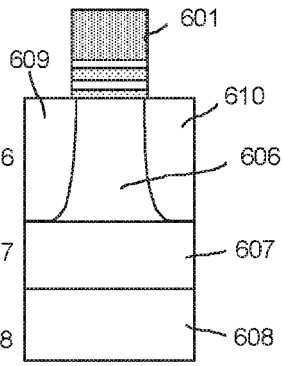
FIG. 6B
FIG. 6C
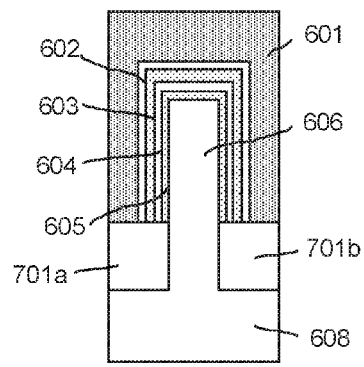
FIG. 7A
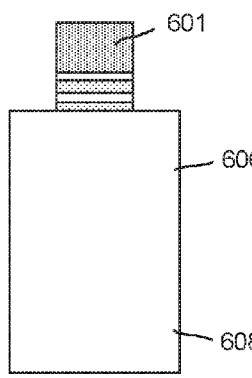
FIG. 7B
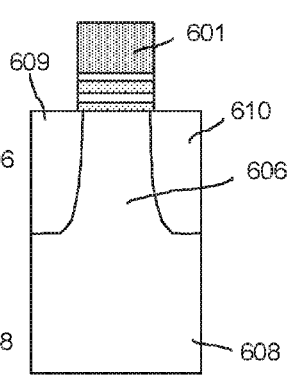
FIG. 7C
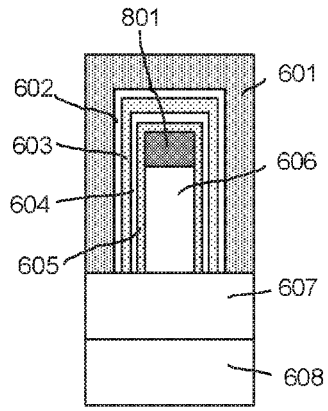
FIG. 8A
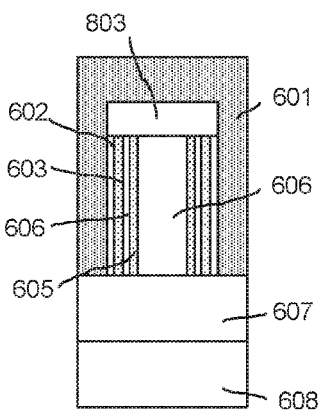
FIG. 8B
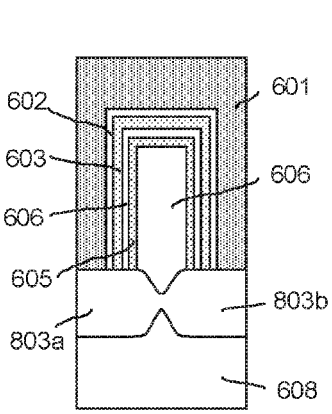
FIG. 8C

DUAL FUNCTION HYBRID MEMORY CELL

PRIORITY

This application claims the benefit of priority based upon U.S. Provisional Patent Application having Application No. 62/152,813, filed on Apr. 24, 2015, and entitled "SONONS—DRAM and NVM Dual-Function Hybrid Memory," which is hereby incorporated herein by reference in its entirety.

FIELD OF THE INVENTION

The exemplary embodiments of the present invention relate generally to the field of semiconductors and integrated circuits, and more specifically to memory and storage devices.

BACKGROUND OF THE INVENTION

Memory devices are widely used in a variety of digital electronics. One type of memory device is a dynamic random access memory (DRAM) device. DRAM devices can be used to form low cost high density memory arrays. For example, one of the largest applications for DRAM is as the main memory in modern computers. Unfortunately, due to the dynamic nature of its configuration, the information stored in DRAM will eventually degrade unless periodic memory refresh cycles are performed. Thus, though DRAM memory cells may be small in size, they may also consume large amounts of power due to the refresh requirements.

Another type of memory device is a non-volatile memory (NVM) device that has long data retention without the use of refresh cycles. This memory may also be referred to as static memory. In contrast to DRAM, NVM memory devices maybe more expensive but consumes less power. Some examples of non-volatile memory include read-only memory (ROM) and Flash memory.

System designers therefore need to select the appropriate memory type for the systems they are designing. This means accounting for the trade-offs between size, cost, speed, and volatility of the different memory types. In some cases, more resources (e.g., size and cost) are allocated for memory where multiple types of memory are needed to obtain the desired memory characteristics. For example, utilizing DRAM memory for speed and NVM memory for data retention may increase the overall space and size requirements of the system.

It is therefore desirable to have a memory cell that provides the functionality of both DRAM and NVM memories in a single memory cell, thereby reducing the cost and size of memory arrays while providing dual functionality.

SUMMARY

In various exemplary embodiments, a novel dual function hybrid memory cell is disclosed. The dual function hybrid memory cell includes two charge-trapping layers between the gate and the channel of the cell. The bottom charge-trapping layer is directly formed on top of the silicon or polysilicon channel. This allows electric charges to be stored in the bottom charge-trapping layer in a much shorter write time and using a lower write voltage. The top charge-trapping layer is isolated by dielectric layers and thus provides much longer data retention. As a result, the single cell may be used as a dual-function memory cell, e.g., DRAM (Dynamic Random-Access Memory) and NVM (Non-Volatile Memory). In one embodiment, the charge-trapping layers and dielectric layers are formed by nitride and oxide layers. Thus, the cell is referred to as a Silicon-Oxide-Nitride-Oxide-Nitride-Silicon (SONONS) cell according to the materials of its vertical structure. In addition to the novel cell structure, several novel programming bias conditions are disclosed that allow either or both of the top and bottom charge-trapping layers to be programmed.

In one aspect, the memory cell includes a substrate, a bottom charge-trapping region formed on the substrate, a top charge-trapping region formed on the bottom charge-trapping region, and a gate layer formed on the top charge-trapping region.

In another aspect, a method for programming a memory cell having a substrate, a bottom charge-trapping layer, a top charge-trapping layer, and a gate layer is disclosed. The method includes biasing a channel region of the substrate, applying a first voltage differential between the gate layer and the channel region, injecting charge into the bottom charge-trapping layer from the channel region based on the first voltage differential. The method also includes applying a second voltage differential between the gate layer and the channel region, and injecting charge from the bottom charge-trapping layer into the top charge-trapping layer based on the second voltage differential.

Additional features and benefits of the present invention will become apparent from the detailed description, figures and claims set forth below.

BRIEF DESCRIPTION OF THE DRAWINGS

The exemplary embodiments of the present invention will be understood more fully from the detailed description given below and from the accompanying drawings of various embodiments of the invention, which, however, should not be taken to limit the invention to the specific embodiments, but are for explanation and understanding only.

FIGS. 6A-8C show exemplary embodiments of novel dual function hybrid memory cells (SONONS cells) implemented using a FinFET process;

DETAILED DESCRIPTION

Exemplary embodiments of the present invention are described herein in the context of a process, device, method, and apparatus for providing a novel dual function hybrid memory cell.

Those of ordinary skilled in the art will realize that the following detailed description is illustrative only and is not intended to be in any way limiting. Other embodiments of the present invention will readily suggest themselves to skilled persons having the benefit of this disclosure. Reference will now be made in detail to implementations of the exemplary embodiments of the present invention as illustrated in the accompanying drawings. The same reference indicators (or numbers) will be used throughout the drawings and the following detailed description to refer to the same or like parts.

It should be noted that the exemplary embodiments are not limited to SONONS cells only and the disclosed aspects can be applied to other types of charge-trapping cells. To realize the low-cost, high-flexibility memory arrays using the disclosed SONONS or other charge-trapping type of cells, the exemplary embodiments disclose a novel array and novel operating conditions. These embodiments and conditions allow the array to be reduced in size while still performing the desired memory operations.

Figure 1:
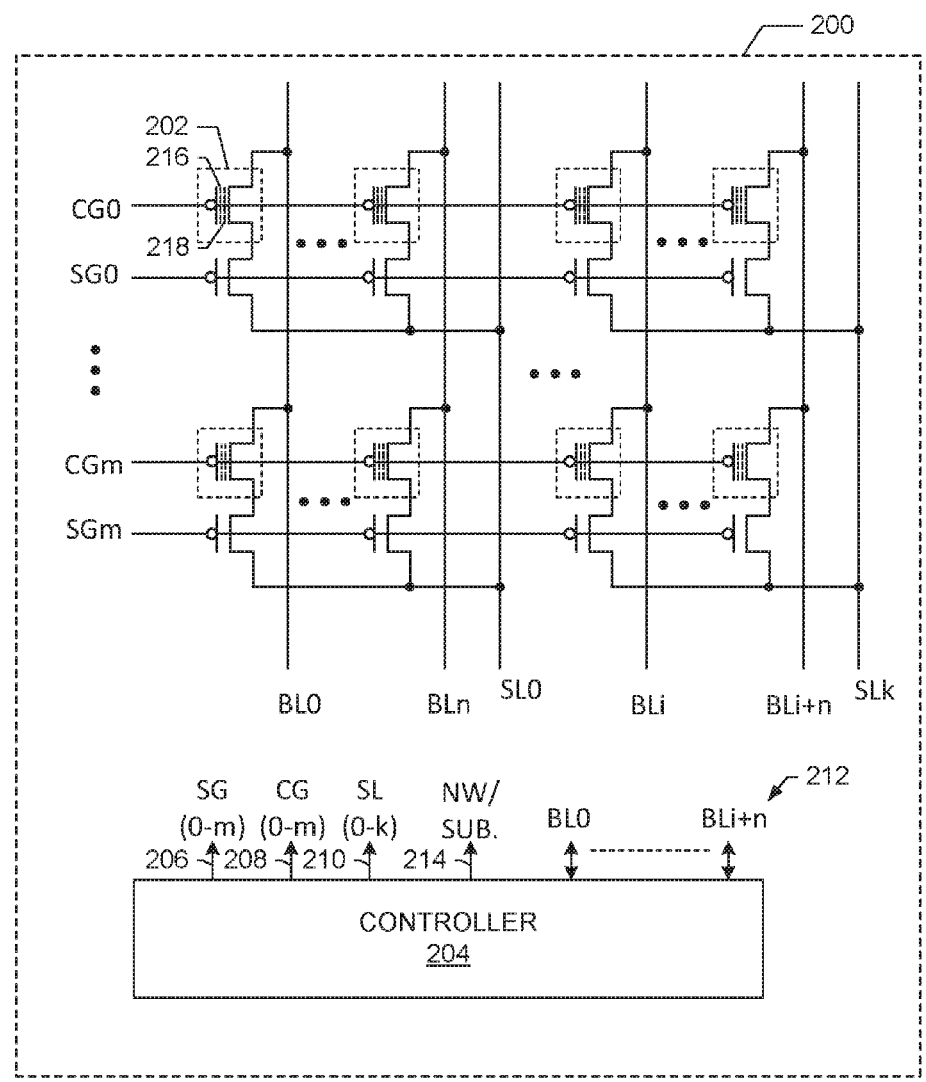
FIG. 1 shows an exemplary embodiment of a memory array that utilizes an exemplary embodiment of a dual function hybrid memory cell structure in accordance with the invention.

FIG. 1 shows an exemplary embodiment of a memory array 200 that utilizes an exemplary embodiment of a dual function hybrid memory cell structure in accordance with the invention. For example, the array 200 is structured as a "NOR" array where multiple bit lines (BL) are coupled to memory cells that share a common select line (SL).

The array 200 comprises dual function hybrid memory cells, such as memory cell 202, that are programmed, erased, and read using control signals generated by controller 204. For example, in an exemplary embodiment, the memory cells comprise SONONS cells that include a top charge-trapping layer 216 and a bottom charge-trapping layer 218. The controller 204 comprises at least one of a CPU, processor, state machine, discrete logic, RAM, ROM and/or any other suitable hardware.

During operation, the controller 204 outputs select gate (SG) 206 control signals, control gate (CG) 208 control signals, and select line (SL) 210 control signals that are coupled to the memory array. A plurality of bit lines (BL) 212 carry data between the memory array and the controller 204. The controller 204 also outputs N-well and/or substrate bias voltages 214 that is coupled to the memory cells. Thus, the controller 204 uses the various control and bias signals to store and retrieve data to and from the memory cells.

In an exemplary embodiment, the memory array comprises select gate transistors and control gate transistors. The control gate transistors, such as transistor 202, act as a storage cell to store charge. The control gate transistors comprise both the top charge-trapping layer 216 and the bottom charge-trapping layer 218. As will be disclosed below, the top charge-trapping layer acts to provide the functionality of a NVM and the bottom charge-trapping layer acts to provide the functionality of a DRAM. Thus, the memory cells operate to provide both short term and long term data storage. For example, in an exemplary embodiment, data for long term storage, such as operating system data, is stored in the top charge-trapping layer. This layer has a long data retention time. Data for short term storage, such as dynamic parameters, are stored in the bottom-charge trapping layer. This layer has a short data retention time but is also quickly accessible. Thus, the dual function hybrid memory cells operate to provide two functions in a single device, which reduces costs and save die space. A more detailed description of the novel dual function hybrid memory cell structure is provided below.

FIGS. 2A-D show exemplary embodiments of dual function hybrid memory cell structures constructed in accordance with the invention.

Figure 2A:
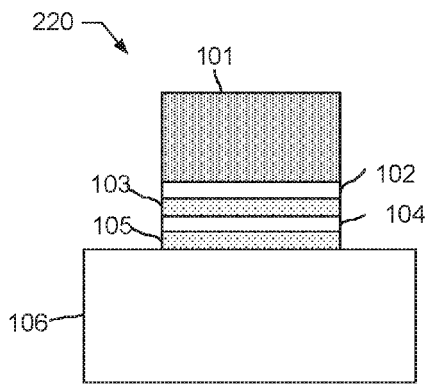
FIGS. 2A-D show exemplary embodiments of novel dual function hybrid memory cell structures constructed in accordance with the invention.

FIG. 2A shows an exemplary embodiment of a cell structure 220 constructed in accordance with the invention. The cell structure 220 includes gate 101 that is formed by a conducting material, such as polysilicon or metal, and a top dielectric layer 102, such as oxide, a high-K material, or other suitable material. The cell structure 220 also includes a top charge-trapping layer 103, such as nitride, nanocrystalline silicon, silicon-rich oxide, Ge nanocrystal, or other suitable materials. Thus, a top charge-trapping region is formed by the layers 102 and 103. The cell structure also includes a bottom dielectric layer 104, such as oxide, a high-K material, or other suitable materials, and a bottom charge-trapping layer 105, such as nitride or other materials as mentioned above with reference to the top charge-trapping layer 103. Thus, a bottom charge-trapping region is formed by the layers 104 and 105. The cell structure also includes a silicon substrate 106. The cell structure 220 has no source and drain junction, and therefore can be referred to as a "junction-less" cell.

In an exemplary embodiment, the nitride layers 103 and 105 have a thickness in the range of 5 nanometers (nm) to 20 nm. They can have the same thicknesses or different thicknesses to optimize performance. For example, the bottom nitride 105 may be thinner to increase the write speed but sacrifices the data retention; while the top nitride 103 may be thicker to enhance the data retention while sacrificing the write speed. The oxide layers 102 and 104 may have several different thickness configurations. In one embodiment, the bottom oxide layer 104 has a thickness in a range of 5 nm to 15 nm. This thin oxide may allow electrons or holes to tunnel through, and thus also is called a tunnel oxide (TOX). Meanwhile, the top oxide layer 102 has a thicker thickness in the range of 15 nm to 30 nm to prevent electrons or holes from tunneling through, and thus also is called a "block oxide." This configuration will allow electrons or holes to tunnel through the bottom oxide 104 to be stored in or removed from the top nitride layer 103 (as shown in FIGS. 3C-D). In another exemplary embodiment, the top oxide 102 is a tunnel oxide and the bottom oxide 104 is block oxide. This configuration will allow electrons or holes to tunnel through the top oxide layer 102 to be stored in or removed from the top nitride layer 103 (as shown in FIGS. 3E-F). Yet in another exemplary embodiment, both the top oxide layer 102 and bottom oxide layer 104 are tunnel oxides. This will allow bi-directional tunneling of electrons or holes through the top or bottom oxide layers.

For clarity and ease of the description, the exemplary embodiments of the cell structure 220 will be described with dielectric layers of oxide and charge-trapping layers of nitride. Therefore, the cell structure 220 can be referred to as a Silicon-Oxide-Nitride-Oxide-Nitride-Silicon (SONONS) cell according to the material used in its vertical structure. It should be noted however, that the materials of the top and bottom dielectric layers and charge-trapping layers are not limited to oxide and nitride and that other suitable materials may be used within the scope of the exemplary embodiments. It should also be noted that the substrate 106 may have P-type doing or N-type doping. When using a P-type substrate, the cell is normally referred to as an N-channel cell or NMOS cell. When using an N-type substrate, the cell is normally referred to as a P-channel cell or PMOS cell.

Figure 2B:
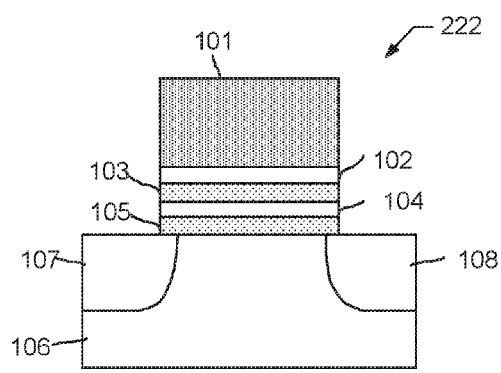

FIG. 2B shows another embodiment of a cell structure 222 constructed in accordance with the invention. The cell structure 222 is similar to the cell structure 220 except that the cell 222 has a source diffusion 107 and a drain diffusion 108. In an exemplary embodiment, the diffusions 107, 108 have the opposite type of doping from the substrate 106.

Figure 2C:
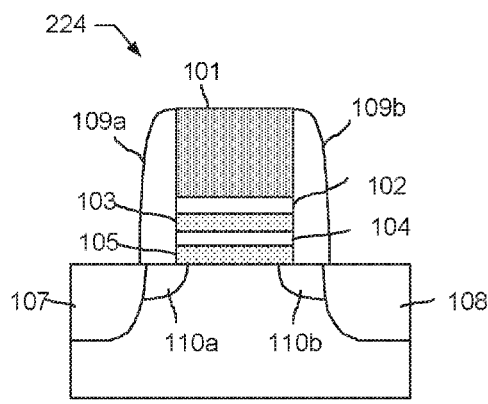

FIG. 2C shows an exemplary embodiment of a cell structure 224 constructed in accordance with the invention. The cell structure 224 is similar to the cell structure 222 except that the cell 224 has sidewall spacers 109a and 109b to define Lightly-Doped-Drain (LDD) regions 110a and 110b to improve the channel-punch-through leakage. This cell structure is popular for use in more advanced process nodes.

Figure 2D:
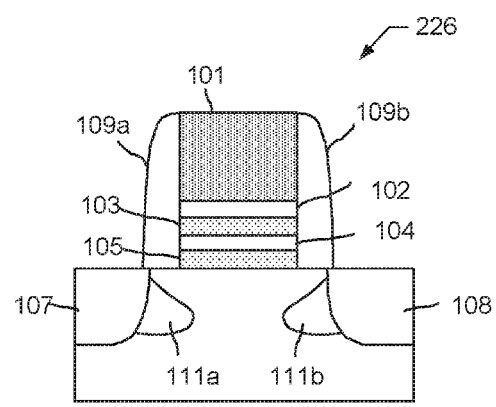

FIG. 2D shows an exemplary embodiment of a cell structure 226 constructed in accordance with the invention. The cell structure 226 is similar to the cell structure 224 except that the cell 226 uses Halo implant regions 111a and 111b to improve the channel-punch-through leakage.

In various exemplary embodiments, the disclosed SONONS cell is used as Dynamic Random-Access Memory (DRAM) cell or a Non-volatile Memory (NVM) cell. To use it as a DRAM cell, the electric charges are stored in the bottom charge-trapping layer 105. This will change the cell's threshold voltage (Vt). Because the bottom charge-trapping layer is directly formed on top of the channel, it has a lower energy barrier for the electron charges to move between the silicon substrate and the charge-trapping layer. Therefore, data can be written using a lower voltage (such as 3V to 5V) and in a shorter time duration (such as 50 ns to 100 ns). However, its data retention time may be several seconds to minutes because it is easier to lose the stored charge. Therefore, this cell configuration is suitable for DRAM applications.

When the cell is used as a NVM cell, a higher write voltage (such as 8V to 10V) and a longer write time duration (such as 10 us to 1 ms) is applied to move the electric charges in or out of the top charge-trapping layer 103. Because the top charge-trapping layer is isolated by the dielectric layers 102 and 104, there is a much longer data retention time when compared to data storage using the bottom charge-trapping layer 105. Therefore, this cell configuration can store data for a long time duration, such as 10 years. By combining the two charge-trapping layers in one cell, the exemplary embodiments can be used as both DRAM and NVM. This provides significant advantages over the conventional devices that operate either as DRAM or NVM.

FIGS. 3A-F show exemplary embodiments illustrating programming operations of the novel dual function hybrid memory cell structure shown in FIG. 2A. For each embodiment, voltages are applied to gate 101 and substrate portions 106. For simplicity, only a gate voltage is shown, however the voltage shown is not necessarily an absolute voltage on the gate terminal. The voltage shown represents a voltage difference between the gate 101 and the channel (e.g., substrate 106). For example, when gate voltage is shown as 4V, this can mean that 4V is applied to the gate and 0V is applied to the channel, or that 2V is applied to the gate and −2V is applied to the channel, or that 0V is applied to the gate and −4V is applied to the channel. Thus, the illustrated gate voltage can be implemented in a variety of ways to obtain the desired voltage difference between the gate and the channel. Moreover, the channel voltage may be supplied from the substrate 106, source 107, or drain 108, (see FIG. 2B) depending on the device type and conditions. For example, when the cell is in an accumulation mode, the channel is turned off and therefore the channel voltage is the substrate voltage.

When the cell is in inversion mode, the channel voltage will be supplied from the source and drain. Moreover, the write voltages are dependent on the cell configuration, such as the configuration of the dielectric layers, thickness of the charge-trapping layer, and process technology. Thus, the voltage values shown are only exemplary and not limiting such that variations of the voltages are within the scope of the exemplary embodiments.

Figure 3A:
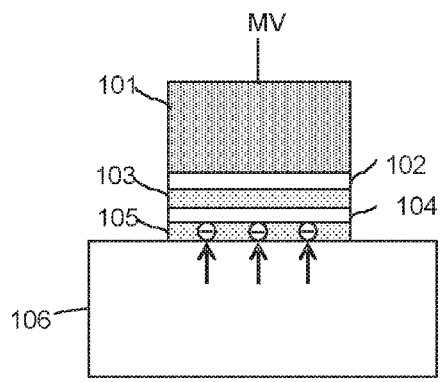
FIGS. 3A-F show exemplary embodiments illustrating programming operations of the novel dual function hybrid memory cell structure shown in FIG. 2.
Figure 3B:
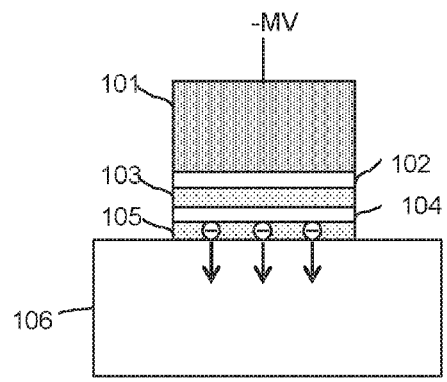
Figure 3C:
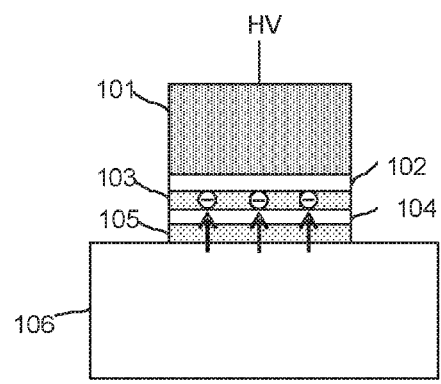
Figure 3D:
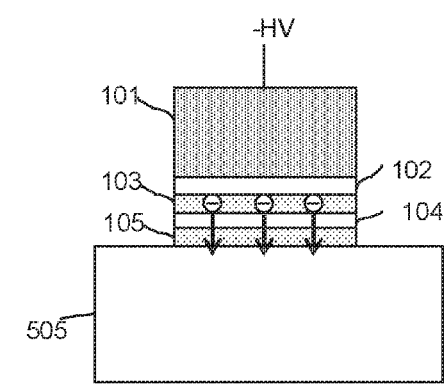
Figure 3E:
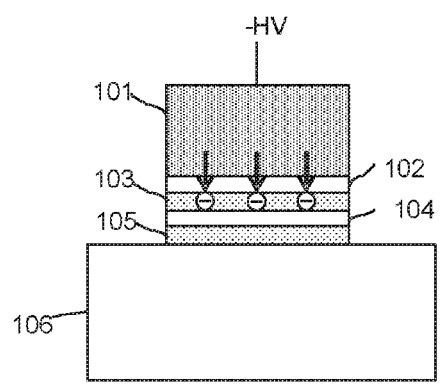
Figure 3F:
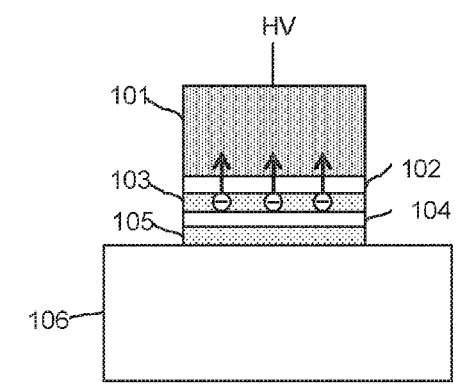

FIGS. 3A-B show exemplary write conditions in a DRAM mode of operation. In FIG. 3A, a medium voltage level, such as 3V to 5V for example, is applied to the gate 101 to form the gate to channel voltage difference. This will attract electrons to inject from the substrate 106 toward the gate 101. The elections will be trapped in the bottom charge-trapping layer 105 since the voltage is not large enough to inject the electrons into the top charge-trapping layer 103. For an N-channel cell, this will increase the cell's Vt. For a P-channel cell, this will decrease the cell's Vt. Therefore, the cell's data is changed to either a "0" or a "1" in a Single-Level Cell (SLC), or to multiple bits of data in a Multiple-Level Cell (MLC).

In FIG. 3B, a negative medium voltage level, such as −3V to −5V for example, is applied to the gate 101. This will expel electrons trapped in the bottom charge-trapping layer 105 toward the substrate 106. This will decrease the N-channel cell's Vt and increase the P-channel cell's Vt.

The write conditions illustrated in FIGS. 3A-B operate to write data (e.g., 1 and 0) to the DRAM portion (bottom charge-trapping layer 105) of the cell. In an exemplary implementation, the write operations can be implemented in two write cycles to write 0 and 1 separately by changing the gate voltage, or in one cycle to write 0 and 1 simultaneously by applying same gate voltage and different drain voltages (e.g., the drain side of the cell would be connected to receive the bit line voltage).

FIGS. 3C-F shows exemplary write conditions for the cell in the NVM mode. In the embodiments shown in FIGS. 3C-D, the cell has a thin bottom dielectric layer 104. In FIG. 3C, a high voltage level, such as 8V to 10V for example, is applied to the gate 101. When the electric field is higher than 10 mV/cm, Fowler-Nordheim (FN) tunneling is induced to inject electrons from the channel and bottom charge-trapping layer 105 into the top charge-trapping layer 103 through the thin bottom dielectric layer 104. This will increase the N-channel device's Vt and decrease the P-channel device's Vt.

In FIG. 3D, a negative high voltage level, such as −8V to −10V for example, is applied to the gate 101. When the electric field is higher than 10 mV/cm, FN tunneling is induced to inject electrons from the top charge-trapping layer 103 toward the channel through the bottom dielectric layer 104. This will decrease the N-channel device's Vt and increase the P-channel device's Vt.

It should be noted that although the embodiments of the NVM cell shown in FIGS. 3C-D are erased and programmed by FN tunneling, the cell's operation is not limited to any particular mechanism. In fact, there are many other mechanisms that may be used to erase and program the cell, such as Band-To-Band-Tunneling (BTBT) injection, Channel-Hot-Electron (CHE) injection, Channel-Hot-Hole-Inducted-Hot-Electron (CHHIHE) injection, Hot-Hole-Injection (HHI), and Punch-through-Assisted-Hot-Electron-Injection (PAHE), in addition to many others. Thus, the disclosed cell structure may be erased and programmed by any suitable mechanism within the scope of the embodiments.

FIGS. 3E-F show exemplary embodiments of write condition for use with the NVM cell. In these embodiments, the cell has thin top dielectric layer 102. In FIG. 3E, when the gate 101 is supplied with a negative high voltage, such as −8V to −10V for example, the vertical electric field will inject electrons from the gate 101 to the top charge-trapping layer 103 through the top dielectric layer 102. In FIG. 3F, when the gate 101 is supplied with a positive high voltage, such as 8V to 10V for example, the vertical electric field will inject electrons from the top charge-trapping layer 103 to the gate 101 through the top dielectric layer 102.

Figure 4A:
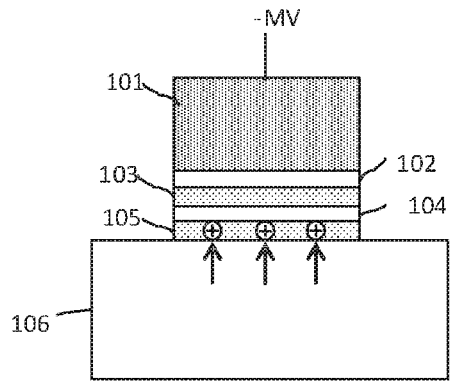
FIGS. 4A-F show exemplary embodiments illustrating programming operations of the novel dual function hybrid memory cell structure shown in FIG. 2 using holes as the electric charge carriers instead of electrons.
Figure 4B:
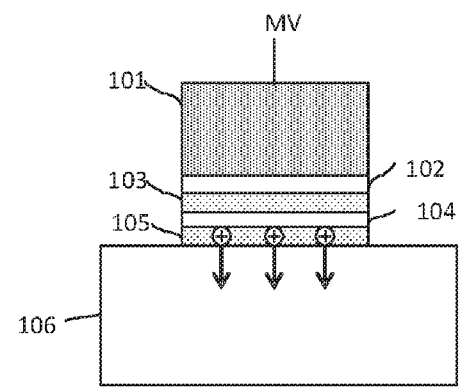
Figure 4C:
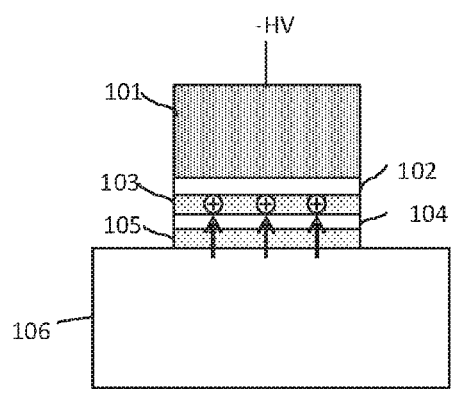
Figure 4D:
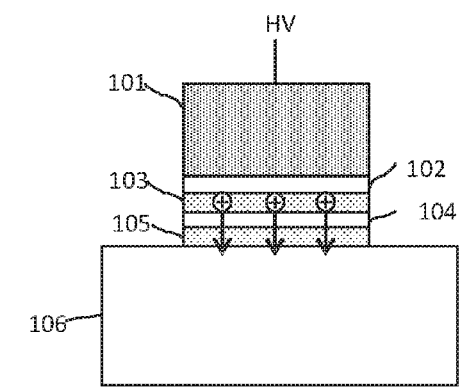
Figure 4E:
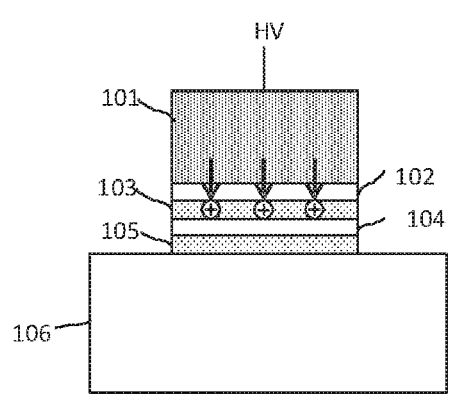
Figure 4F:
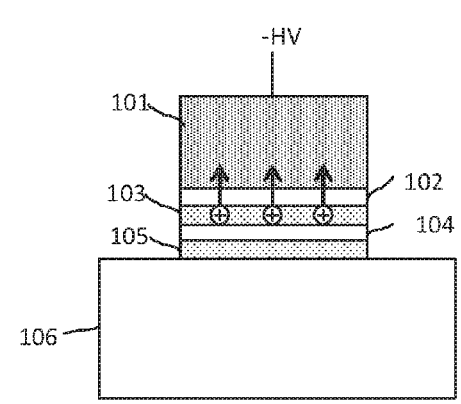

FIGS. 4A-F show exemplary embodiments illustrating programming operations of the novel dual function hybrid memory cell using holes as the electric charge carriers instead of electrons. The operations shown in FIGS. 4A-F are similar to the operations shown in FIGS. 3A-F, respectively. The main difference is that the polarity of the gate voltage in FIGS. 3A-F is reversed in FIGS. 4A-F. When applying positive voltage to the gate 101, holes will be expelled as illustrated in FIG. 4B. When applying negative voltage to the gate 101, holes will be attracted as illustrated in FIG. 4A. In addition, for the N-channel cell, injecting holes into the charge-trapping layer will decrease the cell's Vt. For the P-channel cell, injecting holes into the charge-trapping layer will increase the cell's Vt. Since the operations illustrated in FIGS. 4A-F are analogous to the operations illustrated and described with reference to FIGS. 3A-F, additional descriptions are not provided here. The reader is referred to the detailed descriptions provided with reference to FIGS. 3A-F.

In the exemplary embodiments shown, the cell's data is read by applying a proper read voltage to the gate 101. The read voltage may be between the Vt representing data 1 and 0. This will turn on and off the cell's channel according to the cell's Vt. A voltage difference, such as 1V for example, is applied to the drain and source of the cell. This will cause a channel current to flow between the drain and source if the cell channel is turned on. A sensing circuit is connected to the drain or source to sense the current and determine the data.

In various exemplary embodiments, the SONONS cell may be used as a DRAM cell by storing data in the bottom charge-trapping layer, or as an NVM cell by storing data in the top charge-trapping layer. Thus, a cell array that comprises SONONS cells may be used as an NVM array to store program code for an operating system or for applications. The data of the NVM cell (stored in top charge-trapping layer) may be read and loaded (written) to the DRAM cell (bottom charge-trapping layer) for high-speed execution. In another operation, the cell array may be used as DRAM array to store data, such as files, video, audio, and any other data that may need to be quickly accessed. The system may download the data from the Internet or other source to store in the DRAM portion (bottom charge-trapping layer) of the cell. Thus, the cell provides high-speed read and write operations. After the data is downloaded or edited, the data may be written to the NVM portion (the top charge-trapping layer) of the cells for non-volatile storage.

Figure 5:
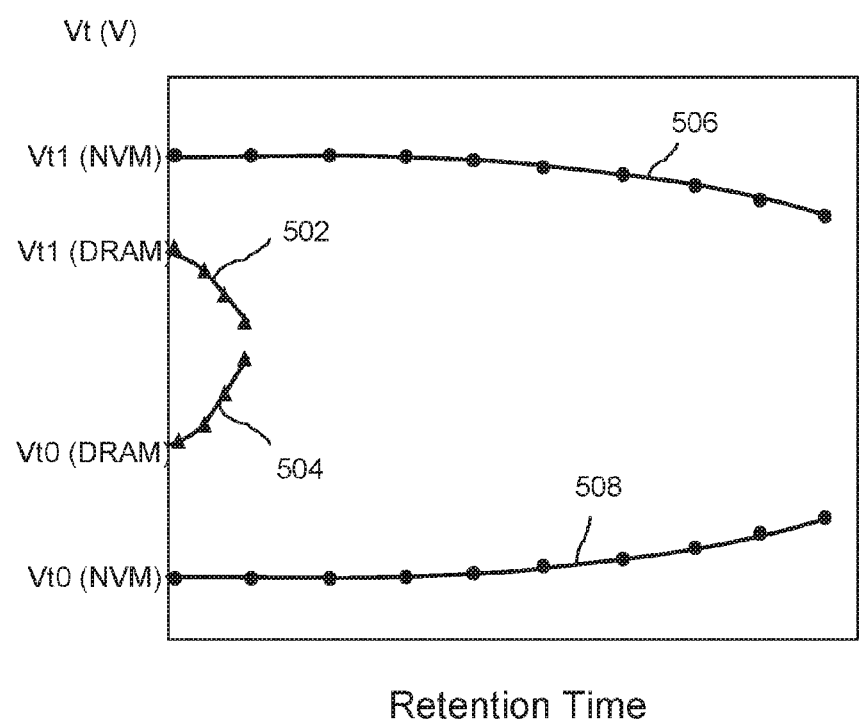
FIG. 5 shows a graph that illustrates an exemplary data retention comparison between a DRAM mode and NVM mode of the novel dual function hybrid memory cell.

FIG. 5 shows a graph 500 that illustrates an exemplary data retention comparison between the novel dual function hybrid memory cell's DRAM mode and NVM mode. For example, the graph 500 illustrates the data retention time in the DRAM mode where the Vt for a data 1 is shown by the plot line 502 and the Vt for a data 0 is shown by the plot line 504. The graph 500 also illustrates the data retention time in the NVM mode where the Vt for a data 1 is shown by the plot line 506 and the Vt for a data 0 is shown by the plot line 500. As illustrated in the graph 500, the DRAM mode has a smaller Vt difference between data 1 and 0 for its lower write voltage and shorter write time. However, the DRAM's data retention time is much shorter (e.g., only a couple of seconds to minutes) when compare with the NVM's data retention time that may be several years.

It should be noted that the disclosed SONONS cell may be manufactured using any suitable process and technology and is not limited to any particular process or technology. For example, the cell may be implemented in CMOS, FinFET, SOI (Silicon-On-Insulator), and any other technologies.

FIGS. 6A-8C show exemplary embodiments of novel dual function hybrid memory cells (SONONS cells) implemented using a FinFET process (also called a Tri-gate process).

FIGS. 6A-C show exemplary embodiments of the SONONS cell using a FinFET in SOI process. FIG. 6A shows a cross-section view along a word line (WL) and FIGS. 6B-C show cross-section views along a bit line (BL). FIGS. 6A-C, show a gate 601, such as polysilicon or metal, a top dielectric layer 602, such as oxide, a top charge-trapping layer 603, such as nitride, a bottom dielectric layer 604, such as oxide, and a bottom charge-trapping layer 605 such as nitride. Also shown is a silicon or polysilicon "fin" 606, a buried oxide (BOX) 607 and a silicon substrate 608. FIG. 6B shows the "junction-less" cell and FIG. 6C shows the cell with diffusion junctions 609 and 610 that may have the opposite type of doping as the channel 606.

FIGS. 7A-C show exemplary embodiments of the SONONS cell using FinFET in a normal wafer process (also called a "bulk silicon" process). This embodiment is similar to the previous embodiment shown in FIGS. 6A-C except that the cell is not formed on top of the buried oxide layer 607. Instead, the cell is formed by etching the silicon substrate 608 to form the fin 606, and then depositing a Shallow-Trench-Isolation (STI) oxide 701a and 701b. Therefore, the channel region 606 is actually connected to the substrate 608. For clarity, the reference numerals of FIGS. 7A-C are kept the same as in FIGS. 6A-C. The reader is referred to the descriptions of FIGS. 6A-C for a detailed description of each referenced feature. It should also be noted that in addition to the embodiments shown in FIGS. 6A-C, there are many other FinFET technologies applicable to implement the exemplary embodiments of SONONS cell structure.

FIGS. 8A-C show exemplary embodiments of the SONONS cell using a another FinFET technology. Because these embodiments are similar to that shown in FIG. 6A, the notations are kept the same as in FIG. 6A for clarity.

In FIG. 8A, the cell structure includes a hard-mask 801, such as a nitride layer, for example, that resides on top of the fin 606 to define the etching pattern of the fin. In FIG. 8B, the ONON layer on top of the fin 606 is etched and filled with an insulation layer 802, such as oxide, to form the ONON layer on both sides of the fin only. This cell structure is also referred to as a "Dual-gate" device. In FIG. 8C, the buried oxide layer 607 is replaced by field oxide 803a and 803b that is formed by local-oxidation. This allows the cell to have channel 606 isolated from the substrate 608 in a normal wafer (bulk silicon) process.

It should be noted that the cell structures shown in FIGS. 6A-8C based on FinFET processes are exemplary and that there are many other FinFET process that may be used within the scope of the embodiments to implement the novel cell structures.

FIGS. 9A-F show exemplary embodiments of novel dual function hybrid memory cells (SONONS cells) implemented using a SOI process.

Figure 9A:
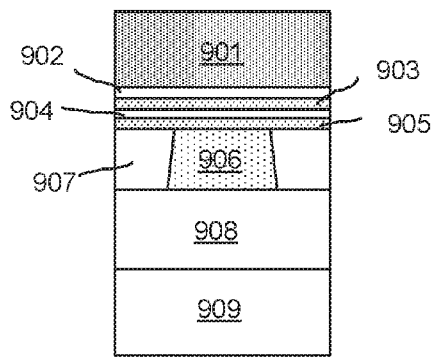
FIGS. 9A-F show exemplary embodiments of novel dual function hybrid memory cells (SONONS cells) implemented using a SOI process.

FIG. 9A shows an exemplary embodiment of a cross-section of a novel SONONS cell taken along a word line. The cell includes a gate 901, such as polysilicon or metal, a top dielectric layer 902, such as oxide, a top charge-trapping layer 903, such as nitride, a bottom dielectric layer 904, such as oxide, a bottom charge-trapping layer 905, such as nitride, and a polysilicon layer 906 as the cell's channel. The cell also includes a field isolation 907, such as STI, a buried oxide (BOX) layer 908, and a silicon substrate 909.

Figure 9B:
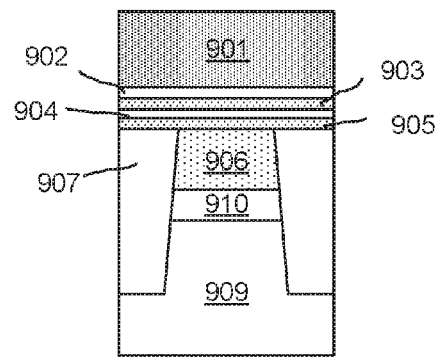

FIG. 9B shows an exemplary embodiment of a novel SONONS cell implemented using a FD-SOI (Fully-Depleted-SOI) process. This cell structure is similar to the cell structure shown in FIG. 9A except the buried oxide layer 908 is replaced by an ultra-thin buried oxide layer 910 and the field oxide 907 penetrates the ultra-thin buried oxide layer 910.

Figure 9C:
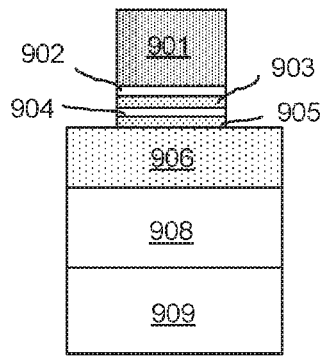
Figure 9D:
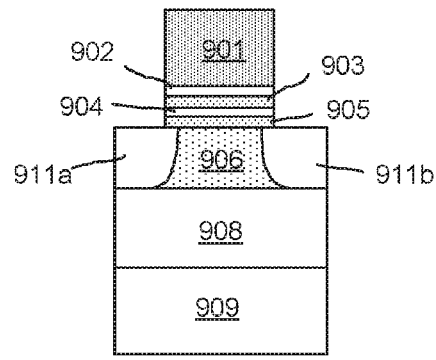

FIGS. 9C-D show cross section views of the novel SONONS cell taken along a bit line. FIG. 9C shows the "junction-less" cell and FIG. 9D shows the cell with diffusion junctions 911*a* and 911*b* that may have the opposite type of doping as the channel 906.

Figure 9E:
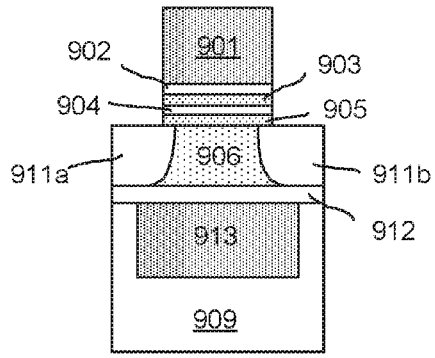
Figure 9F:
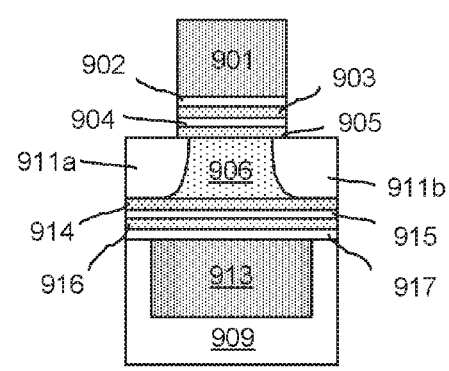

FIGS. 9E-F show exemplary embodiments of a novel SONONS cell structure constructed using a "Back-gate" or "Double-gate" SOI process. In this embodiment, the cell has an extra "back-gate" 913 buried in the oxide 909. The back-gate is formed by a conductor layer, such as polysilicon or metal.

In FIG. 9E, the back-gate 913 is coupled to the channel 906 through a gate dielectric layer 912, such as oxide. This cell structure allows the cell to have two gates. The front-gate 901 can be used as the SONONS cell, and the back-gate 913 can be used as a pass-transistor.

In another embodiment shown in FIG. 9F, a top charge-trapping layer 914, top dielectric layer 915, bottom charge-trapping layer 916, and bottom dielectric layer 917 are formed above the back-gate 913. This structure allows both the front-gate 901 and back-gate 913 be used as SONONS cells. Because the two gates may be separately operated, the front-gate and back-gate can store different data, and therefore this embodiment is equivalent to two cells.

The various exemplary embodiments of the disclosed SONONS cells may be used to implement any type of memory array architecture, such as NAND array, NOR array, AND array, Virtual-ground array, and many other types of array architectures. Thus, the cells are not limited to any particular type of array.

Figure 10A:
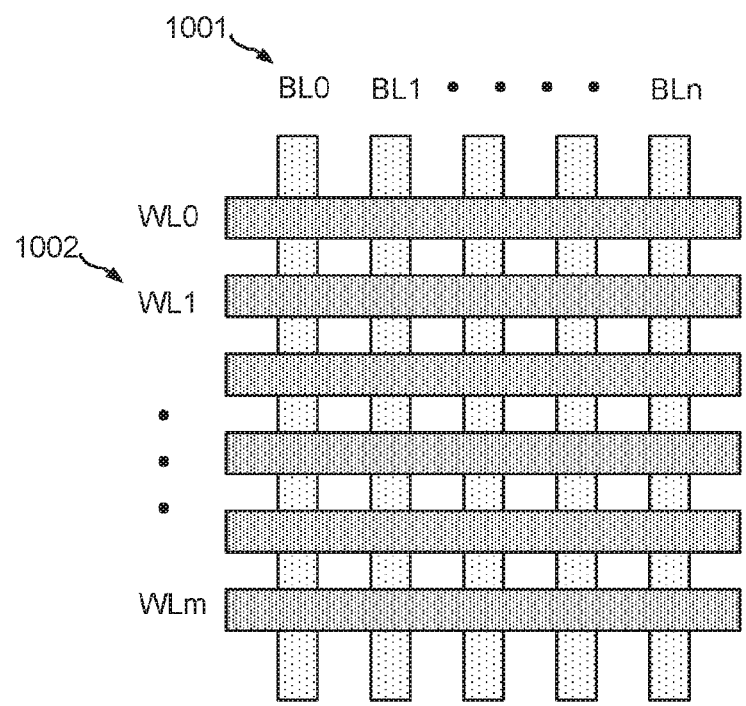
FIGS. 10A-C show exemplary embodiments of a NAND array architecture comprising novel dual function hybrid memory cells (SONONS cells)
Figure 10B:
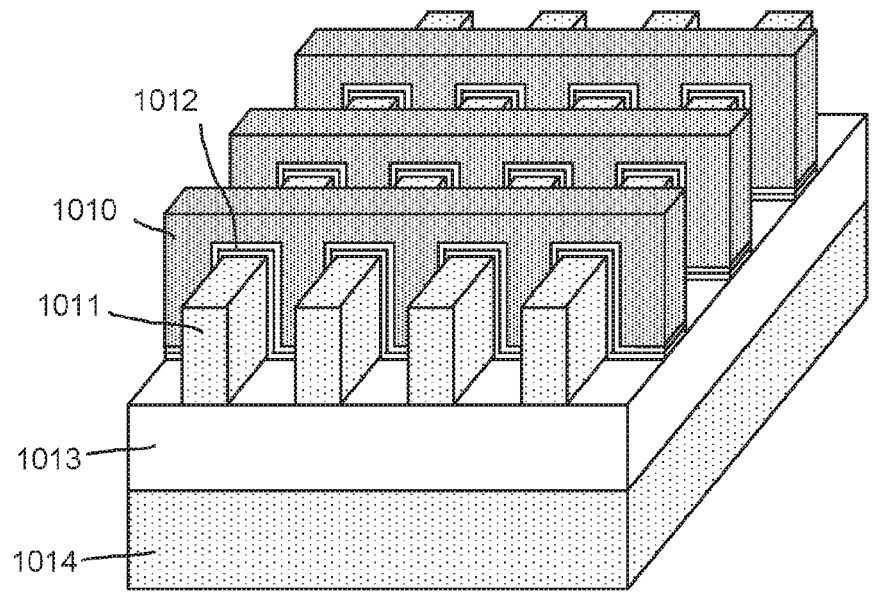
Figure 10C:
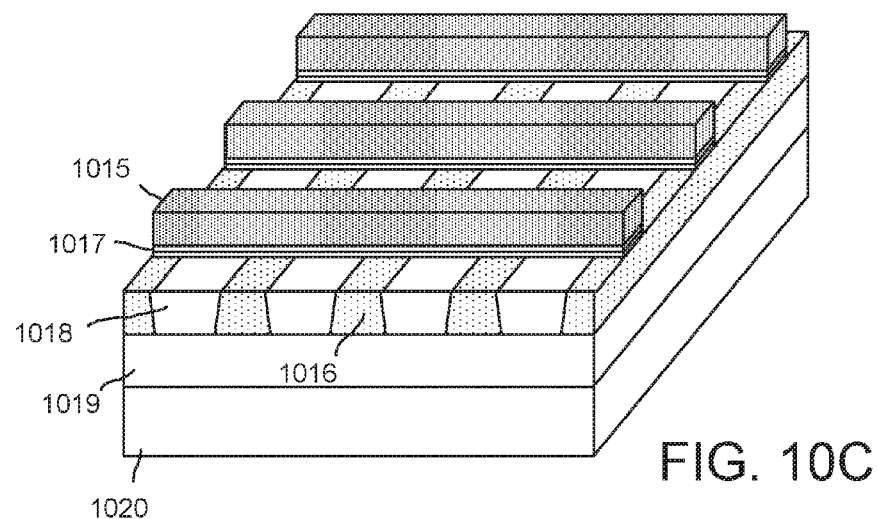

FIGS. 10A-C show exemplary embodiments of a NAND array architecture comprising novel dual function hybrid memory cells (SONONS cells).

FIG. 10A shows an exemplary embodiment of a NAND array architecture that comprises the novel SONONS cells. The array includes bit lines (BL0-BLn) 1001, and word lines (WL0-WLm) 1002. The array can be manufactured using any suitable process, such as CMOS, FinFET, SOI, and many other types of processes.

FIG. 10B shows an exemplary embodiment of a NAND array architecture that comprises novel SONONS cells based on a FinFET process. As illustrated in FIG. 10B, the word lines are formed by polysilicon or metal 1010. The bit lines are formed by silicon or polysilicon fins 1011. Between the word lines and bit lines, ONON layers 1012 are formed to perform the dual-function storage. The bit lines may be formed on top of a buried oxide layer 1013 and a silicon substrate 1014. In accordance with the exemplary embodiments, the cells may be junction-less cells or normal cells with junctions.

FIG. 10C shows an exemplary embodiment of a NAND array architecture that comprises novel SONONS cells based on a SOI process. As illustrated in FIG. 10C, the word lines are formed by a polysilicon or metal (see 1015). Also shown are bit lines formed by silicon or polysilicon diffusion layer (see 1016), ONON layers 1017, field isolation 1018, such as STI, buried oxide layer 1019, and silicon substrate 1020. In accordance with the exemplary embodiments, the cells may be junction-less cells or normal cells with junctions.

FIGS. 11A-E show additional array architectures comprising novel dual function hybrid memory cells (SONONS cells).

Figure 11A:
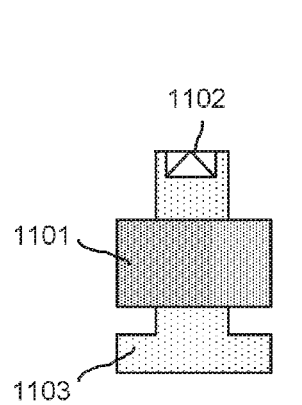
FIGS. 11A-E show additional array architectures comprising novel dual function hybrid memory cells (SONONS cells)

FIG. 11A shows an exemplary embodiment of a single-transistor (1T) NOR array cell that is formed by word line 1101, bit line contact 1102 that connects to a vertical metal bit line (not shown), and source line (SL) 1103.

Figure 11B:
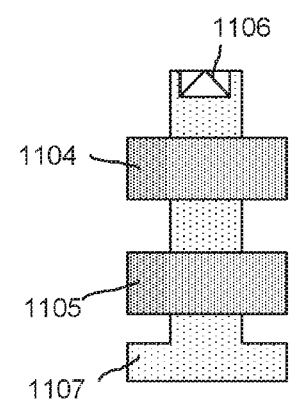

FIG. 11B shows an exemplary embodiment of a two-transistor (2T) NOR array cell formed by two transistors that are coupled to word lines 1104 and 1105. A bit line contact 1106 is connected to a vertical metal bit line (not shown). Also included is source line 1107. In one exemplary embodiment, the transistor in word line 1104 is the select gate and the transistor in word line 1105 is the novel cell. In another exemplary embodiment, the transistor in word line 1104 is the cell and the transistor in word line 1105 is the select gate. In yet another exemplary embodiment, both the transistors in word line 1104 and 1105 are comprised of the novel cells.

Figure 11C:
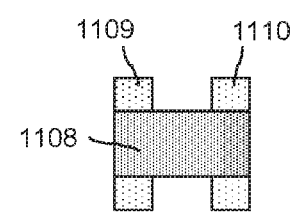

FIG. 11C shows another exemplary embodiment of the novel SONONS cell in a "virtual-ground" array or "buried-diffusion" array where a word line 1108 crosses a diffusion bit line 1109 and source line 1110 that run in parallel. The bit line and source line may be shared with the adjacent cells. In another embodiment, the cell's bit line and source line are separated from the adjacent cell's bit line and source line by field isolation, such as STI. An array implemented this way is called an AND array.

Figure 11D:
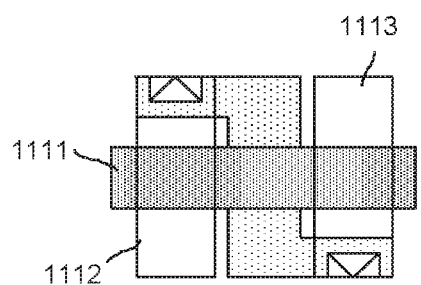

FIG. 11D shows another exemplary embodiment of the novel SONONS cell in a metal-bit-line AND array where a word line 1111 crosses a metal bit line 1112 and source line 1113 that run in parallel.

Figure 11E:
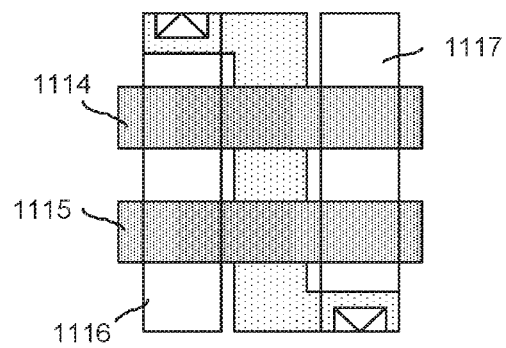

FIG. 11E shows another exemplary embodiment of the novel SONONS cell in a 2T metal-bit-line AND array having word lines 1114 and 1115 and bit line 1116 and source line 1117. Similar to FIG. 11B, the transistors in word line 1114 and 1115 may be one novel SONONS cell and one select transistor or both SONONS cells.

Figure 12:
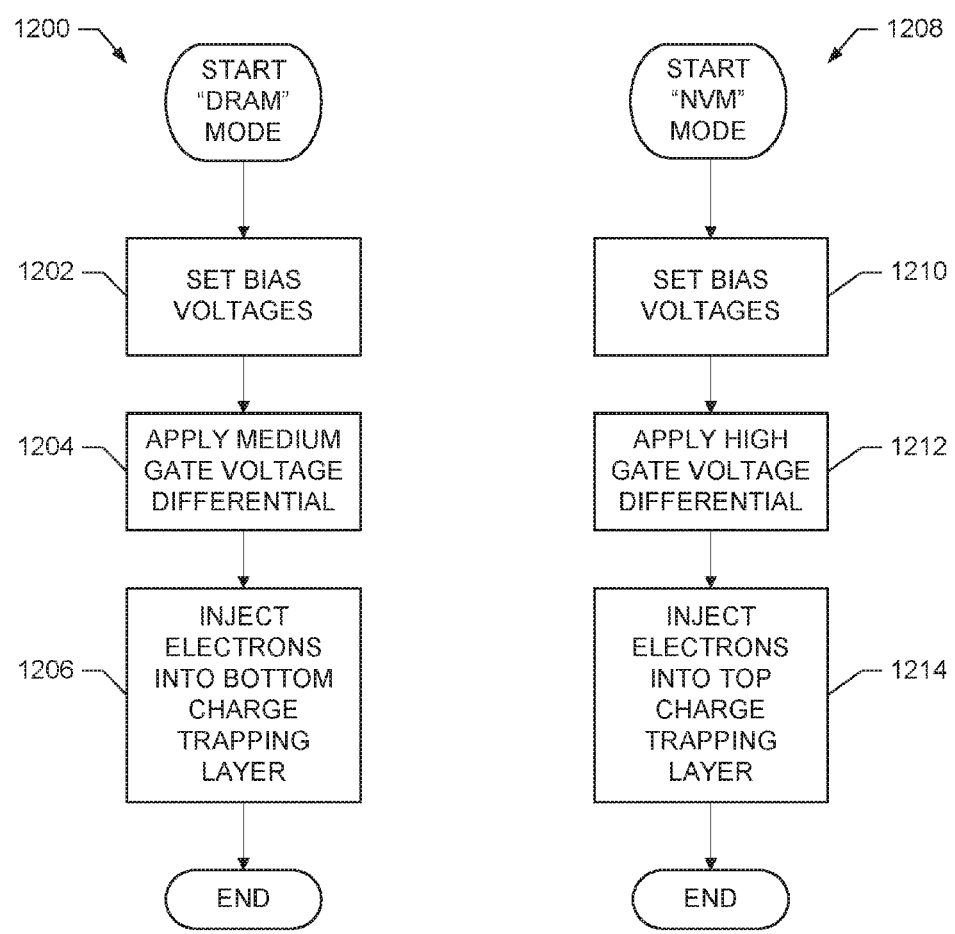
FIG. 12 shows exemplary embodiments of methods for programming a novel dual function hybrid memory cell.

FIG. 12 shows exemplary embodiments of methods for programming a novel dual function hybrid memory cell (SONONS cell). For example, the method is suitable for use with the SONONS cell shown in FIGS. 2A-D, which includes a bottom charge-trapping layer 105 for short term storage and a top charge-trapping layer 103 for long term storage.

The method 1200 operates to program the novel SONONS cell for short term data storage in a DRAM mode.

At block 1202, bias voltages are set for a channel region of the substrate and if necessary the source and drain of the SONONS cell. For example, a bias voltage is applied to the substrate 106 by the controller 204.

At block 1204, a medium gate voltage differential level is set to enable storage of charge in the bottom charge-trapping layer. For example, the controller 204 supplies a medium gate voltage differential to the cell. In an exemplary embodiment, the voltage differential between the gate and the channel region of the substrate is set to a medium voltage level in the range of 3-5 volts.

At block 1206, electrons are injected into the bottom charge-trapping layer due to the medium gate voltage differential level. For example, as illustrated in FIG. 3A, electrons are injected from the channel to the bottom charge-trapping layer 105. The injection of electrons changes the Vt of the cell according to the description above.

Thus, the method 1200 operates to program the novel SONONS cell for short term data storage in a DRAM mode.

The method 1208 operates to program the novel SONONS cell for long term data storage in a NVM mode.

At block 1210, bias voltages are set for a channel region of the substrate and if necessary the source and drain of the SONONS cell. For example, a bias voltage is applied to the substrate 106 by the controller 204.

At block 1212, a large gate voltage differential level is set to enable storage of charge in the bottom charge-trapping layer. For example, the controller 204 supplies a large gate voltage differential to the cell. In an exemplary embodiment, the voltage differential between the gate and the channel region of the substrate is set to a large voltage level in the range of 8-10 volts.

At block 1214, electrons are injected into the top charge-trapping layer due to the large gate voltage differential level. For example, as illustrated in FIG. 3C, electrons are injected from the channel to the top charge-trapping layer 103. The injection of electrons changes the Vt of the cell according to the description above.

Thus, the method 1208 operates to program the novel SONONS cell for long term data storage in a NVM mode. It should be noted that the methods 1200 and 1208 are exemplary and that the disclosed operations may be combined, rearranged, and/or modified within the scope of the embodiments.

It should be noted that the voltage values shown in the description and figures are exemplary and do not limit the described voltages to exact voltage values. It is obvious that the actual voltages used depend on the technology, process, and/or other factors. It should also be noted that the disclosed cells and bias conditions can be utilized with any type of array structures and that the bias conditions are not limited to specific array types.

While exemplary embodiments of the present invention have been shown and described, it will be obvious to those with ordinary skills in the art that based upon the teachings herein, changes and modifications may be made without departing from the exemplary embodiments and their broader aspects. Therefore, the appended claims are intended to encompass within their scope all such changes and modifications as are within the true spirit and scope of the exemplary embodiments of the present invention.

What is claimed is:

1. An apparatus, comprising:
   a substrate;
   a bottom charge-trapping region formed on the substrate and configured to provide functionality of non-volatile memory (NVM);
   a top charge-trapping region formed on the bottom charge-trapping region and configured to provide functionality of dynamic random-access memory (DRAM); and
   a gate layer formed on the top charge-trapping region.

2. The apparatus of claim 1, wherein the bottom charge-trapping region comprises a bottom nitride layer formed on the substrate and a bottom oxide layer formed on the bottom nitride layer.

3. The apparatus of claim 2, wherein the bottom nitride layer has a thickness in the range of 5 nm to 20 nm and the bottom oxide layer has a thickness in the range of 5 nm to 30 nm.

4. The apparatus of claim 2, wherein the top charge-trapping region comprises a top nitride layer formed on the bottom oxide layer and a top oxide layer formed between the top nitride layer and the gate layer.

5. The apparatus of claim 4, wherein the top nitride layer has a thickness in the range of 5 nm to 20 nm and the top oxide layer has a thickness in the range of 5 nm to 30 nm.

6. The apparatus of claim 1, wherein the top charge-trapping region comprises a top nitride layer formed on the bottom charge-trapping layer and a top oxide layer formed between the top nitride layer and the gate layer.

7. The apparatus of claim 1, wherein a first voltage differential between the gate layer and a channel region of the substrate causes charge to flow between the substrate and the bottom charge-trapping layer.

8. The apparatus of claim 7, wherein the first voltage differential is a voltage level in a voltage range of 3-5 volts.

9. The apparatus of claim 8, wherein a second voltage differential between the gate layer and the channel region of the substrate layer causes charge to flow between the bottom charge-trapping layer and the top charge-trapping layer.

10. The apparatus of claim 9, wherein the second voltage differential is a voltage level in a voltage range of 8-10 volts.

11. The apparatus of claim 1, wherein a voltage differential between the gate layer and a channel region of the substrate causes charge to flow between the substrate layer and the top charge-trapping layer.

12. The apparatus of claim 11, wherein the voltage differential is a voltage level in a voltage range of 8-10 volts.

13. The apparatus of claim 1, wherein a voltage differential between the gate layer and a channel region of the substrate causes charge to flow between the gate layer and the top charge-trapping layer.

14. The apparatus of claim 13, wherein the voltage differential is a voltage level in a voltage range of 8-10 volts.

15. The apparatus of claim 1, further comprising source and drain diffusions deposited in the substrate.

16. The apparatus of claim 1, further comprising Lightly-Doped-Drain (LDD) regions deposited in the substrate.

17. The apparatus of claim 1, further comprising Halo implant regions deposited in the substrate.

18. A method for programming a memory cell having a substrate, a bottom charge-trapping layer, a top charge-trapping layer, and a gate layer, the method comprising:
   biasing a channel region of the substrate;
   applying a first voltage differential between the gate layer and the channel region to provide a medium gate voltage differential of a dynamic random-access memory (DRAM) mode for short term data storage; and
   injecting charge into the bottom charge-trapping layer from the channel region based on the first voltage differential for DRAM storage.

19. The method of claim 18, further comprising:
   applying a second voltage differential between the gate layer and the channel region; and
   injecting charge from the bottom charge-trapping layer into the top charge-trapping layer based on the second voltage differential.

20. A method for programming a memory cell having a substrate, bottom charge-trapping layer, a top charge-trapping layer, and a gate layer, the method comprising:
   biasing a channel region of the substrate;
   applying a voltage differential between the gate layer and the channel region;
   injecting charge into the top charge-trapping layer from the channel region based on the voltage differential for non-volatile memory (NVM) storage;
   applying a medium gate voltage differential between the gate layer and the channel region to activate a dynamic random-access memory (DRAM) mode for short term data storage; and
   injecting charge into the bottom charge-trapping layer from the channel region based on the medium gate voltage differential for DRAM storage.

* * * * *